United States Patent
Nam

[19]

[11] Patent Number: 6,159,780
[45] Date of Patent: Dec. 12, 2000

[54] METHOD OF FABRICATING SEMICONDUCTOR DEVICE ON SOI SUBSTRATE

[75] Inventor: Myung-Hee Nam, Suwon, Rep. of Korea

[73] Assignee: Hyundai Electronics Industries Co., Ltd., Kyoungki-do, Rep. of Korea

[21] Appl. No.: 09/276,096

[22] Filed: Mar. 25, 1999

Related U.S. Application Data

[62] Division of application No. 08/996,964, Dec. 23, 1997, Pat. No. 5,920,094.

[30] Foreign Application Priority Data

Dec. 30, 1996 [KR] Rep. of Korea ...................... 96-77715

[51] Int. Cl.[7] .................................................. H01L 21/00
[52] U.S. Cl. ........................ 438/163; 438/311; 438/800
[58] Field of Search ..................................... 438/163, 149, 438/311, 197, 200, 211, 226; 117/43; 257/347, 349, 352, 382, 374

[56] References Cited

U.S. PATENT DOCUMENTS

| | | |
|---|---|---|
| 5,034,335 | 7/1991 | Widdershoven . |
| 5,693,959 | 12/1997 | Inoue et al. ............................... 257/66 |
| 5,929,490 | 7/1999 | Onishi ...................................... 257/347 |

FOREIGN PATENT DOCUMENTS

| | | |
|---|---|---|
| 62-76775 | 4/1987 | Japan . |
| 62-274778 | 11/1987 | Japan . |
| 8-172199 | 7/1996 | Japan . |

OTHER PUBLICATIONS

English translation of Abstract for JP8–172199 (Jul. 2, 1996).
English translation of Purpose and Constitution for JP62–274778 (Nov. 28, 1987).
English translation of Purpose and Constitution for JP62–76775 (Apr. 8, 1987).

*Primary Examiner*—Charles Bowers
*Assistant Examiner*—Craig Thompson
*Attorney, Agent, or Firm*—Ware, Fressola, Van Der Sluys & Adolphson LLP

[57] ABSTRACT

Disclosed herein is a semiconductor device and a method of fabricating the same. The semiconductor device includes a SOI substrate comprising a handling wafer, a buried insulating layer and a silicon layer; a gate electrode formed on the silicon layer; a first junction region formed on the first portion of the silicon layer, wherein bottom of the first junction region is positioned at a selected depth from the surface of the first portion of the silicon layer; a second junction region of the second conductivity type, formed on the second portion of the silicon layer at a selected depth from the surface of the second portion of the silicon layer; an intermediate insulating layer formed on the overall surface of the SOI substrate including the gate electrode, and the first and second junction regions; a first conduction line formed on the intermediate insulating layer, an extending portion of the first conduction line being extended to the bottom of the first junction region through the intermediate insulating layer and the underlying first junction region; and a second conduction line formed on the intermediate insulating layer, an extending portion of the second conduction line being extended to the upper surface of the second junction region.

3 Claims, 3 Drawing Sheets

METHOD OF FABRICATING SEMICONDUCTOR DEVICE ON SOI SUBSTRATE

CROSS-REFERENCE TO RELATED APPLICATION

This is a divisional application of parent U.S. patent application Ser. No. 08/996,964, filed Dec. 23, 1996, U.S. Pat. No. 5,920,094 and from which priority is claimed under 35 USC 120.

BACKGROUND OF THE INVENTION

1. Field of the Invention

The present invention generally relates to a semiconductor device and a method of fabricating the same, and more specifically to a metal oxide semiconductor field effect transistor(MOSFET) which is formed on a silicon on insulator (SOI) substrate comprising a handling wafer, a buried insulating layer formed on the handling wafer and a silicon layer formed on the buried insulating layer.

2. Description of the Related Art

An SOI substrate generally includes a handling wafer, a silicon layer where a semiconductor device to be formed, and a buried insulating layer which is electrically isolated between the silicon layer and the handling wafer. In contrast to a bulk transistor which is formed on a single crystalline silicon substrate, a MOSFET formed on the SOI substrate does not need a well forming process. Also, since isolation layer of the SOI substrate comes into contact with the buried insulating layer, the active regions of the MOSFET are completely isolated, to thereby prevent the latch-up which is one of the problems in a CMOS transistor.

The SOI substrate can be also formed by a bonding method which bonds a silicon wafer having an insulating layer formed thereon to a handling wafer, or separation by implanted oxygen (SIMOX) method in which oxygen ions are deeply implanted into a silicon wafer to form a buried insulating layer.

A conventional semiconductor device using the SOI substrate is explained below with reference to FIG. 1. Referring to FIG. 1, a SOI substrate 10 includes a handling wafer 1, an insulating layer 2 and an impurity doped silicon layer 3. The silicon layer 3 of the SOI substrate 10 is the body of a MOSFET, which does not connected with any electrode. A gate insulating layer 4 and a polysilicon layer are sequentially formed on the silicon layer 3, and patterned, to form a gate electrode 5. Impurities having a conductivity type opposite to that of the silicon layer 3 are ion-implanted into a selected portion of the silicon layer 3, placed in both sides of the gate electrode 5, to form source/drain regions 6. Then, side-wall spacers 7 are formed on the side walls of gate electrode 5 by a well-known method. An intermediate insulating layer 8 is formed to a selected thickness on the overall surface of the substrate, and selectively etched to expose the source/drain regions 6. Metal lines 9 are formed on the intermediate insulating layer 8, to come into contact with the source/drain regions 6.

The aforementioned conventional semiconductor device formed on the SOI substrate has the following problems. When the semiconductor device is in a partial depletion state, holes generated in the drain region move to the silicon layer 4 whose potential is lower than that of the drain region, to be accumulated therein. The accumulation of hole in the silicon layer 3 increases the potential of the silicon layer 3, resulting in decrease in the threshold voltage of the semiconductor device. Furthermore, when the channel region of the MOSFET is saturated, moving charges in the channel come into collision with the molecules of the silicon lattice of the silicon layer 3. This generates a large amount of holes, which is called "impact ionization effect". Here, since the silicon layer 3 is floated, it is difficult to remove the large amount of holes from the SOI substrate 10. Accordingly, the large amount of holes flow to source/drain regions 6 by the electric field which is created during operation of the MOSFET. This brings about kink effect, increasing the drain current. The kink effect limits the circuit design of the MOSFET formed on the SOI substrate 10.

SUMMARY OF THE INVENTION

Accordingly, the present invention is directed to a semiconductor device and a method of fabricating the same that substantially obviates one or more of the problems due to limitations and disadvantages of the related art.

It is an object of the present invention to provide a semiconductor device which stabilizes its threshold voltage.

It is another object of the present invention to provide a semiconductor device which prevents kink effect.

It is still another object of the invention to provide method of fabricating above semiconductor device.

To accomplish the objects of the present invention, there is provided a semiconductor device including: a SOI substrate comprising of a handling wafer, a buried insulating layer formed on the handling wafer and a silicon layer of a first conductivity type, formed on the buried insulating layer, wherein the silicon layer consists of a first and second portions, and the first portion is thicker than the second portion so that the silicon layer has a stepped portion between the first and second portions; a gate electrode formed on the silicon layer including the stepped portion; a gate insulating layer formed between the gate electrode and the silicon layer; a first junction region of a second conductivity type opposite to the first conductivity type, formed on the first portion of the silicon layer, wherein bottom of the first junction region is positioned at a selected depth from the surface of the first portion of the silicon layer; a second junction region of the second conductivity type, formed on the second portion of the silicon layer at a selected depth from the surface of the second portion of the silicon layer; an intermediate insulating layer formed on the overall surface of the SOI substrate including the gate electrode, and the first and second junction regions; a first conduction line formed on the intermediate insulating layer, an extending portion of the first conduction line being extended to the bottom of the first junction region through the intermediate insulating layer and the underlying first junction region; and a second conduction line formed on the intermediate insulating layer, an extending portion of the second conduction line being extended to the upper surface of the second junction region.

According to another aspect of the present invention, a method of fabricating a semiconductor device includes the steps of: providing a SOI substrate comprising of a handling wafer, a buried insulating layer formed on the handling wafer and a silicon layer of a first conductivity type, formed on the buried insulating layer; selectively etching a selected portion of the silicon layer to a selected depth, to divide the silicon layer into two portions of a first and second portions, wherein the first portion is thicker than the second portion so that the silicon layer has a stepped portion between the first and second portions; forming a gate insulating layer on a selected portion of the silicon layer including the stepped portion; forming a gate electrode on the gate insulating layer; implanting impurities into selected portions of the silicon layer placed in both sides of the gate electrode, to form source/drain regions, wherein the source region is formed on the first portion of the silicon layer, and the drain region is formed on the second portion of the silicon layer; forming an intermediate insulating layer on the overall surface of the SOI substrate including the gate electrode, and the source/drain regions; forming contact holes to expose selected portions of the source/drain regions; and forming a conduction line to be contact with the exposed source/drain regions. A contact hole formed in the first portion of the silicon layer is extended to the bottom face of the source region, while a contact hole formed in the second portion of the silicon layer is extended to the upper surface of the drain region or may be extended to more deep position of the drain region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description and serve to explain the principles of the invention:

DETAILED DESCRIPTION OF PREFERRED EMBODIMENT

Reference will now be made in detail to the preferred embodiments of the present invention, examples of which are illustrated in the accompanying drawings.

In a semiconductor device formed on an SOI substrate according to the present invention, a conduction line is electrically connected to source region of semiconductor device, whose circumference as well as the bottom face of the conduction line comes into contact with the silicon layer of the SOI substrate, so as to easily remove holes generated in the silicon layer of the SOI substrate.

Figure 1:
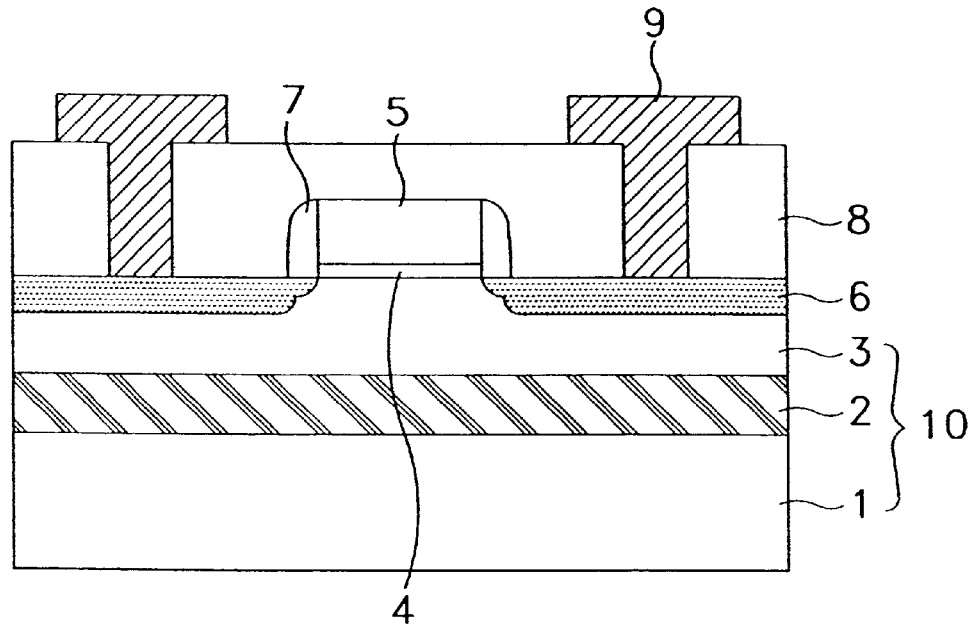
FIG. 1 is a cross-sectional view of a conventional semiconductor device.
Figure 2:
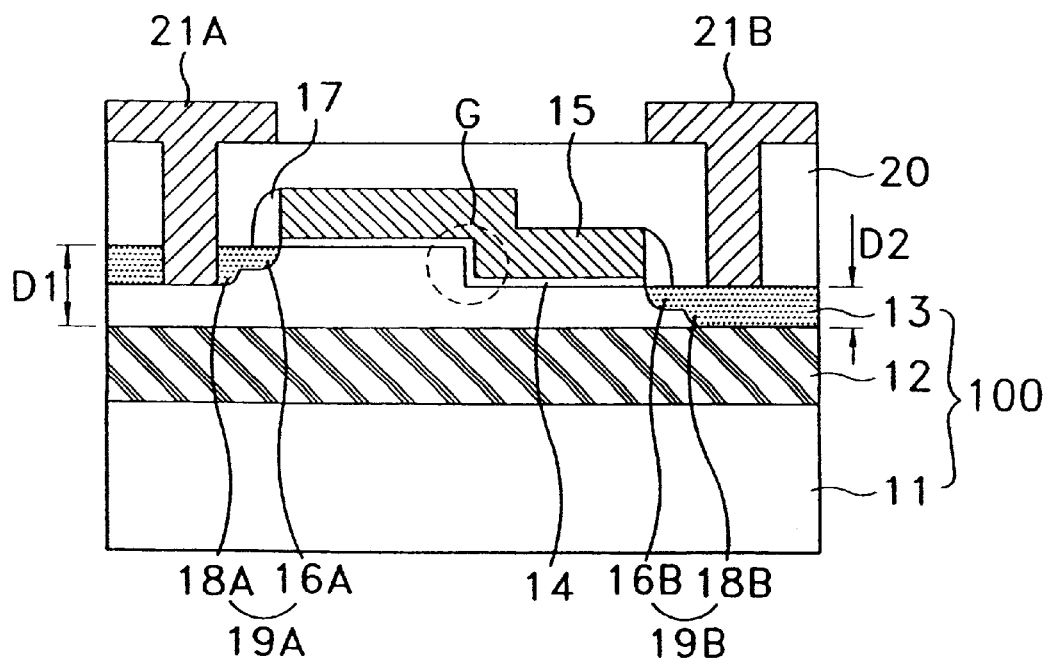
FIG. 2 is a cross-sectional view of a semiconductor device according to an embodiment of the present invention.

Referring to FIG. 2, there is provided a SOI substrate 100. The SOI substrate 100 includes a handling wafer 11, a buried insulating layer 12 formed on the handling wafer 11 and a silicon layer 13 formed on the buried insulating layer 12. The silicon layer 13 is a first conductivity type, for example, p-type. The silicon layer 13 is divided into two portion of a first portion and a second portion. Here, the first portion is thicker than the second portion. Hence, the silicon layer 13 has a structure including a stepped portion G between the first and second portions. As shown in FIG. 2, thickness D1 of the first portion of the silicon layer 13, placed on one side of gate electrode 15, is thicker than thickness D2 of the second portion of the silicon layer 15, placed in the other side of gate electrode 15. The stepped portion G is formed in a predetermined region of silicon layer 13. Here, the second portion of the silicon layer 13 is as thick as a junction region to be formed during a subsequent process.

A gate insulating layer 14 and a gate electrode 15 are sequentially formed on a selected portion of silicon layer 13 including the stepped portion G. Spacers 17 made of insulator, preferably, of silicon oxide, are formed on both sides of gate electrode 15. Lightly doped impurity regions 16A and 16B are formed in predetermined portions of the silicon layer 13, placed under spacers 17, and heavily doped impurity regions 18A and 18B are formed to come into contact with one side of lightly doped impurity 16A and 16B. Hence, source and drain regions 19A and 19B consist of the lightly doped impurity regions 16A and 16B, and heavily doped impurity regions. The Source region 19A is formed in the first portion of the silicon layer 13, and the drain region 19B is formed in the second portion of the silicon layer 13. The drain region 19B comes into contact with the surface of the buried insulating layer 12, and the bottom of the source region 19A has a selected distance from buried insulating layer 12. The source region 19A may be equal to the drain region 19B in depth.

An intermediate insulating layer 20 is formed on silicon layer 13 in which the source and the drain regions 19A and 19B are formed, and the gate electrode 15. A first conduction line 21A which transmits an external electrical signal to the source region 19A is formed on the intermediate insulating layer 20 so that an extending portion thereof is extended to the lower surface of the source region 19A. A second conduction line 21B which transmits an external electrical signal to the drain regions 19B is also formed on the intermediate insulating layer 20 so that an extending portion thereof is extended to the upper surface of the drain region 19B. Here, the bottom of the first conduction line 21A comes into contact with the silicon layer 13, and its side-walls come into contact with the source region 19A and intermediate insulating layer 20. The bottom of the second conduction line 21B comes into contact with the surface of the drain region 19B and its side-walls come into contact with the intermediate insulating layer 20.

In the semiconductor device constructed as above, the silicon layer 13 is different in either side thickness due to stepped portion G. Accordingly, the first conduction line 21A comes into contact with the silicon layer 13 serving as the body of the MOSFET, as well as source region 19A. Thus, the holes, generated in silicon layer 13 according to the impact ionization effect, go out of the silicon layer 13 through the first conduction line 21A. Therefore, the kink effect is prevented, and the substrate bias of the silicon layer 13 is reduced, to thereby stabilize the threshold voltage of the MOSFET. Furthermore, since the gate electrode 15 is formed on the silicon layer 13 including stepped portion G, the effective channel length increases by the height of stepped portion G. This prevents hot carrier effect due to a short channel, and short channel effect which decreases the threshold voltage.

A method of fabricating the above-described semiconductor device is explained below.

Figure 3A:
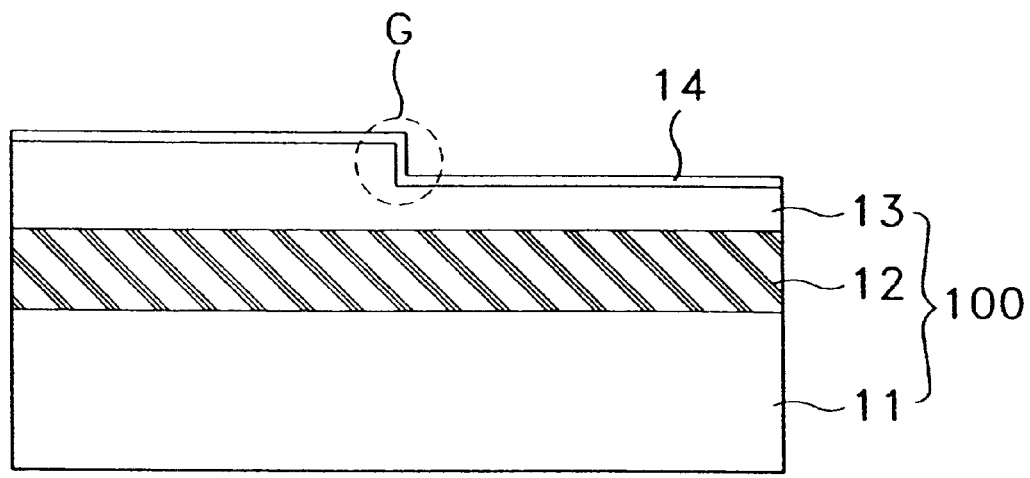
FIGS. 3A to 3D are cross-sectional views showing a method of fabricating a semiconductor device according to the present invention.

Referring to FIG. 3A, a SOI substrate 100 is prepared, which includes a handling wafer 11, a buried insulating layer 12 and a silicon layer 13 which are sequentially stacked in accordance with the mentioned order. Here, the SOI substrate 100 can be also formed using SIMOX technique in which oxygen ions are implanted into a silicon wafer to form the buried oxide layer, or bonding technique which bonds a silicon wafer having an insulating layer formed thereon to another silicon wafer. The silicon layer 13 may be a silicon layer containing p-type impurities. A predetermined portion of silicon layer 13 is selectively etched to form a stepped portion G. That is, a resist pattern (not shown) is formed on a selected portion of the silicon layer 13, the exposed portion is etched to a selected depth using the resist pattern as a mask, and the resist pattern is then removed, to form the stepped portion G. By doing so, the silicon layer 13 whose thickness is partially different is obtained. Thereafter, a gate insulating layer 14 is formed on the silicon layer 13 including the stepped portion G.

Figure 3B:
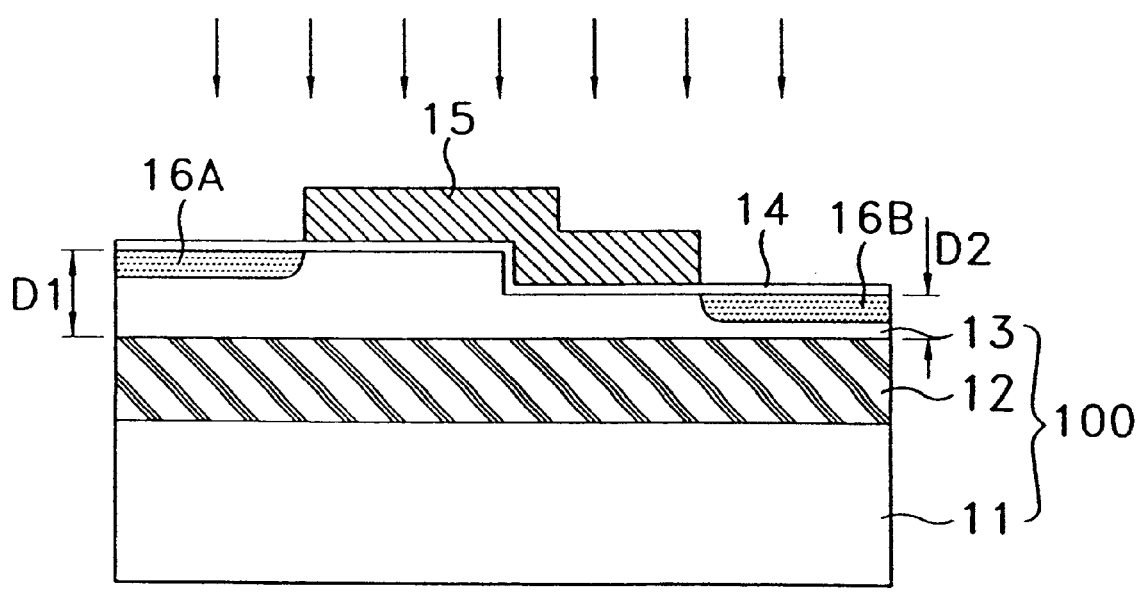

Referring to FIG. 3B, a gate electrode 15 of, for example, an impurity-doped polysilicon, is formed on a selected portion of the silicon layer 13 including the stepped portion G. Thus, the silicon layer 13 of one side of gate electrode 15 has a first thickness D1, and the silicon layer 13 of the other side has a second thickness D2 thinner than D1. An n-type impurity such as phosphorus(P) is ion-implanted at a low concentration($10^{12}$~$10^{13}$ atoms/cm$^2$) into a portion of the silicon layer 13, placed under both sides of the gate electrode 13, in order to form lightly doped impurity regions 16A and 16B.

Figure 3C:
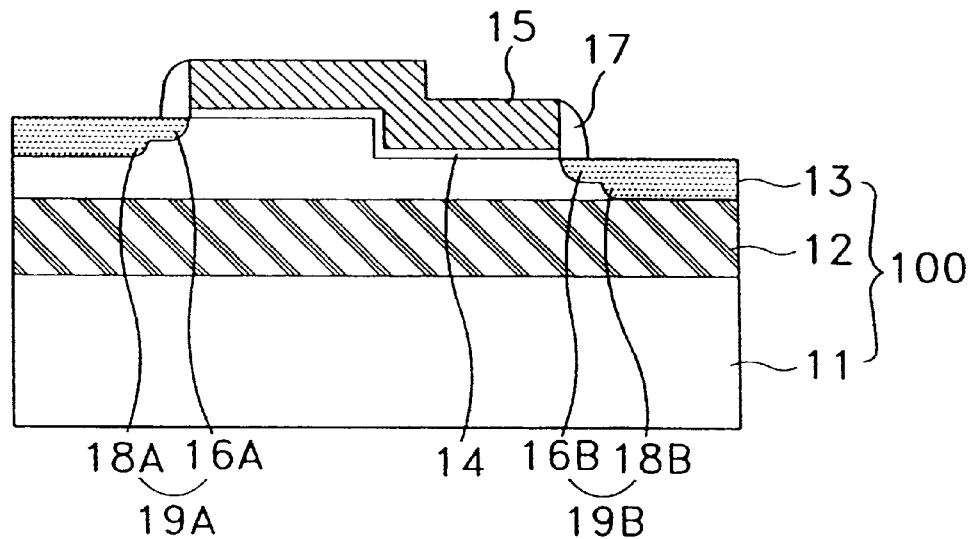

Referring to FIG. 3C, an insulating layer (not shown) such as silicon oxide is formed on the silicon layer 13 in which lightly doped impurity regions 16A and 16B are formed, and selectively etched through an anisotropic blanket etching, to form spacers 17 on both side walls of gate electrode 15. An n-type impurity such as arsenic(As) is implanted in a high concentration($10^{15}$~$10^{16}$ atoms/cm$^2$) into the silicon layer 13 using spacers 17 as a mask, to form heavily doped impurity regions 18A and 18B. Source and drain region 19A and 19B consist of the lightly doped impurity regions 16A and 16B, and heavily doped impurity regions.

Figure 3D:
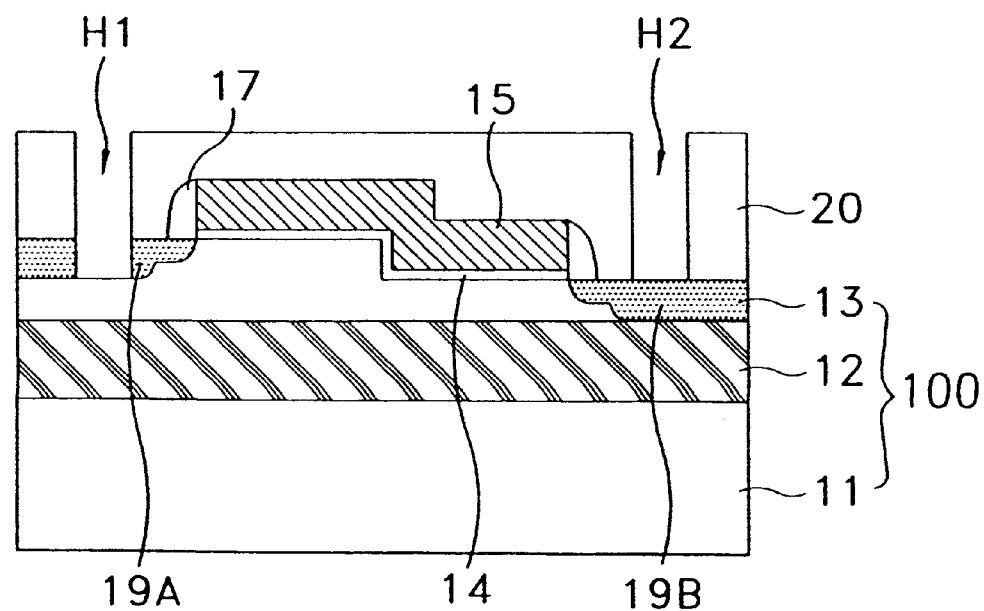

Referring to FIG. 3D, an intermediate insulating layer 20 is formed on the overall surface of the SOI substrate 100 including the gate electrode 15, the source/drain regions 19A/19B, and the spacers 17. Contact holes H1, H2 are formed in selected portions of the intermediate insulating layer 20. From the formation of the contact hole H1, the silicon layer 13 and inner walls of the source region 19A and the intermediate insulation layer 20, are exposed. Also, from the formation of the contact hole H2, the drain region 19B and inner wall of the intermediate insulating layer 20 are exposed. Thereafter, as shown in FIG. 2, a first and a second conduction line 21A and 21B are formed in the contact holes H1, H2 and on the intermediate insulating layer, in order to provide contacts with the exposed portions, by a well-known method.

Though the p-type silicon layer, and n-type source/drain region are used in the aforementioned embodiment, n-type silicon layer and p-type source/drain region can be also used.

As described above, according to the present invention, the first conduction line 21A is connected to the silicon layer 13 as well as the source region 19A, so that the holes, generated in silicon layer 13 by the impact ionization effect, go out of the SOI substrate 100 through the first conduction line 21A. Accordingly, the kink effect is prevented, and substrate bias of the silicon layer 13 is reduced, to stabilize the threshold voltage the MOSFET. Furthermore, since the gate electrode 15 is formed on a region including stepped portion G, the effective channel length increases by the height of the stepped portion. This prevent hot carrier effect due to the short channel, and short channel effect which decreases the threshold voltage.

It will be apparent to those skilled in the art that various modifications and variations can be made in the semiconductor device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:

providing a SOI substrate including a handling wafer, a buried insulating layer formed on the handling wafer and a silicon layer of a first conductivity type, formed on the buried insulating layer;

selectively etching a selected portion of the silicon layer to a selected depth, to divide the silicon layer into two portions of a first and second portions, wherein the first portion is thicker than the second portion so that the silicon layer has a stepped portion between the first and second portions;

forming a gate insulating layer on a selected portion of the silicon layer including the stepped portion;

forming a gate electrode on the gate insulating layer;

implanting impurities into selected portions of the silicon layer placed in both sides of the gate electrode, to form source/drain regions, wherein the source region is formed on the first portion of the silicon layer, the drain region is formed on the second portion of the silicon layer;

forming an intermediate insulating layer on the overall surface of the SOI substrate including the gate electrode, and the source/drain regions;

forming contact holes to expose selected portions of the source/drain regions; and forming a conduction line to be contact with the exposed source/drain regions, wherein the contact hole formed in the first portion of the silicon layer is extended to the bottom face of the source region, and the contact hole formed on the second portion of the silicon layer is extended to the surface of the drain region.

2. The method as claimed in claim 1, wherein the first conductivity type is a p-type, and second conductivity type is an n-type.

3. The method as claimed in claim 1, wherein the first conductivity type is an n-type, and second conductivity type is a p-type.

* * * * *